(12) United States Patent
Toh et al.

(10) Patent No.: US 10,746,694 B2
(45) Date of Patent: Aug. 18, 2020

(54) INTEGRATED CIRCUITS WITH SENSORS AND METHODS FOR PRODUCING THE SAME

(71) Applicant: Globalfoundries Singapore Pte. Ltd., Singapore (SG)

(72) Inventors: Eng Huat Toh, Singapore (SG); Bin Liu, Singapore (SG); Shyue Seng Tan, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/203,769

(22) Filed: Nov. 29, 2018

(65) Prior Publication Data
US 2020/0173959 A1 Jun. 4, 2020

(51) Int. Cl.
*H01L 27/12* (2006.01)
*G01N 27/414* (2006.01)

(52) U.S. Cl.
CPC ..... *G01N 27/4148* (2013.01); *G01N 27/4145* (2013.01); *H01L 27/1207* (2013.01)

(58) Field of Classification Search
CPC ............ G01N 27/4148; G01N 27/4145; H01L 27/1207
See application file for complete search history.

(56) References Cited

U.S. PATENT DOCUMENTS

| | | | |
|---|---|---|---|
| 2009/0259902 A1* | 10/2009 | Tahata | H01L 21/823456 714/728 |
| 2009/0283805 A1* | 11/2009 | Chou | C23C 14/0641 257/253 |
| 2015/0171018 A1* | 6/2015 | Hoque | H01L 23/552 257/253 |
| 2015/0330941 A1* | 11/2015 | Smith | H01L 29/66969 257/253 |
| 2016/0131613 A1* | 5/2016 | Jayant | C12Q 1/6869 506/9 |
| 2017/0146485 A1* | 5/2017 | Parris | H01L 27/11526 |
| 2018/0059052 A1* | 3/2018 | Hoque | G01N 27/4148 |
| 2018/0372679 A1* | 12/2018 | Ayele | G01N 27/4148 |

OTHER PUBLICATIONS

Barbaro et al., "A CMOS, Fully Integrated Sensor for Electronic Detection of DNA Hybridization", IEEE Electron Device Letters, Jul. 2006, pp. 595-597, vol. 27, No. 7.

(Continued)

*Primary Examiner* — Sitaramarao S Yechuri
(74) *Attorney, Agent, or Firm* — Thompson Hine LLP

(57) ABSTRACT

Integrated circuits and methods of producing the same are provided. In an exemplary embodiment, an integrated circuit includes a detection layer, a substrate, and a transistor having a transistor gate electrode, a transistor source, and a transistor drain. A capacitor gate electrode overlies the substrate, where the capacitor gate electrode and the transistor gate electrode are electrically connected with each other and with the detection layer. A capacitor well is defined within the substrate, and a gate insulator is positioned between the capacitor well and the capacitor gate electrode. A capacitor includes the capacitor gate electrode, the gate insulator, and the capacitor well.

18 Claims, 8 Drawing Sheets

(56) References Cited

OTHER PUBLICATIONS

Chen et al., Folded Floating-Gate CMOS Biosensor for the Detection of Charged Biochemical Molecules, IEEE Sensors Journal, Nov. 2011, pp. 2906-2910, vol. 11, No. 11.

Huang et al., High Performance Dual-Gate ISFET with Non-ideal Effect Reduction Schemes in a SOI-CMOS Bioelectrical SoC, IEDM, 2015, pp. 747-750.

Kurzwell, "Metal Oxides and Ion-Exchanging Surfaces as pH Sensors in Liquids: State-of-the-Art and Outlook", Sensors, 2009, pp. 4955-4985.

\* cited by examiner

INTEGRATED CIRCUITS WITH SENSORS AND METHODS FOR PRODUCING THE SAME

TECHNICAL FIELD

The technical field generally relates to integrated circuits with sensors and methods of producing the same, and more particularly relates to integrated circuits with sensors including detection layers and sensor circuitry with reduced complexity and size, and methods of producing the same.

BACKGROUND

A sensor is a device that may be used for the detection of an analyte with a physical detector. A biosensor is a sensor that combines a biological component with the physical detector. For example, a biosensor may be based on the use of "capture molecules" that are immobilized on a detection layer surface, where the capture molecules selectively hybridize with "target molecules." For instance, an antibody-binding fragment of an antibody, or a sequence of a DNA single strand, may function as the "capture molecule." This capture molecule fits a corresponding sequence or structure of the target molecule. When the capture molecule binds at the detection layer surface, an electrical property of the detection layer changes. This change in the electrical property of the detection layer can be detected and read as a "sensor event."

Sensor circuitry is used to read a change in the detection layer and thereby detect a sensor event may include a transistor and a capacitor, where the transistor and capacitor are electrically coupled to the detection layer. Reductions in the size and complexity of the sensor circuitry can reduce the size of the sensor, where the sensor includes the sensor circuitry and the detection layer. Reduced size allows for utilization of sensors in new areas or functions, and can also reduce costs.

Accordingly, it is desirable to provide sensors with sensor circuitry that is smaller than existing sensor circuitry, and methods of producing the same. In addition, it is desirable to provide sensors with sensor circuitry that can be produced using fewer manufacturing steps than existing sensor circuitry, and methods of producing the same. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a detection layer, a substrate, and a transistor, where the transistor has a transistor gate electrode, a transistor source, and a transistor drain. A capacitor gate electrode overlies the substrate, where the capacitor gate electrode and the transistor gate electrode are electrically connected with each other and with the detection layer. A capacitor well is defined within the substrate, and a gate insulator is positioned between the capacitor well and the capacitor gate electrode. A capacitor includes the capacitor gate electrode, the gate insulator, and the capacitor well.

An integrated circuit is provided in another exemplary embodiment. The integrated circuit includes a detection layer and a transistor having a transistor gate electrode, a transistor source, and a transistor drain. A capacitor includes a capacitor gate electrode, where the transistor gate electrode, the capacitor gate electrode, and the detection layer are all electrically connected. A capacitor second plate is separated from the capacitor gate electrode by a gate insulator, where the capacitor second plate underlies the capacitor gate electrode.

A method of producing an integrated circuit is provided in yet another embodiment. The method includes forming a capacitor well within a substrate, and forming a gate insulator overlying the capacitor well. A capacitor gate electrode is formed overlying the gate insulator, where a capacitor includes the capacitor well, the gate insulator, and the capacitor gate electrode. A transistor is formed that includes a transistor gate electrode that overlies the substrate, where the transistor gate electrode and the capacitor gate electrode are electrically connected. A detection layer is formed and electrically connected with the transistor gate electrode and the capacitor gate electrode.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a sensor with a detection layer and associated sensor circuitry. The sensor circuitry includes a transistor and a capacitor, where the transistor includes a transistor gate electrode overlying a substrate. The capacitor is formed with a capacitor gate electrode overlying the substrate, where the capacitor gate electrode may be formed at the same time and on the same level as the transistor gate electrode so the same manufacturing processes may be utilized. The capacitor gate electrode serves as a capacitor first plate of the capacitor, and a capacitor second plate is formed and is defined within the substrate underlying the capacitor gate electrode. The capacitor second plate includes capacitor first and second terminals on opposite sides of the capacitor gate electrode, where the capacitor first and second terminals primarily include different types of conductivity determining impurities, and where the capacitor first and second terminals are electrically connected. This structure of the capacitor second plate allows for the area of the substrate underlying the capacitor gate electrode to serve as the capacitor second gate. No additional capacitor plate overlying the capacitor gate electrode is required, so the manufacturing processes to produce such an overlying capacitor plate can be dispensed with. The production of the capacitor and transistor in a single layer over the substrate, with a capacitor second plate defined within the substrate underlying the capacitor gate electrode, reduces manufacturing processes and the overall size and manufacturing costs of the sensor circuitry when compared to processes utilizing two capacitor plates defined overlying the substrate.

Figure 1:
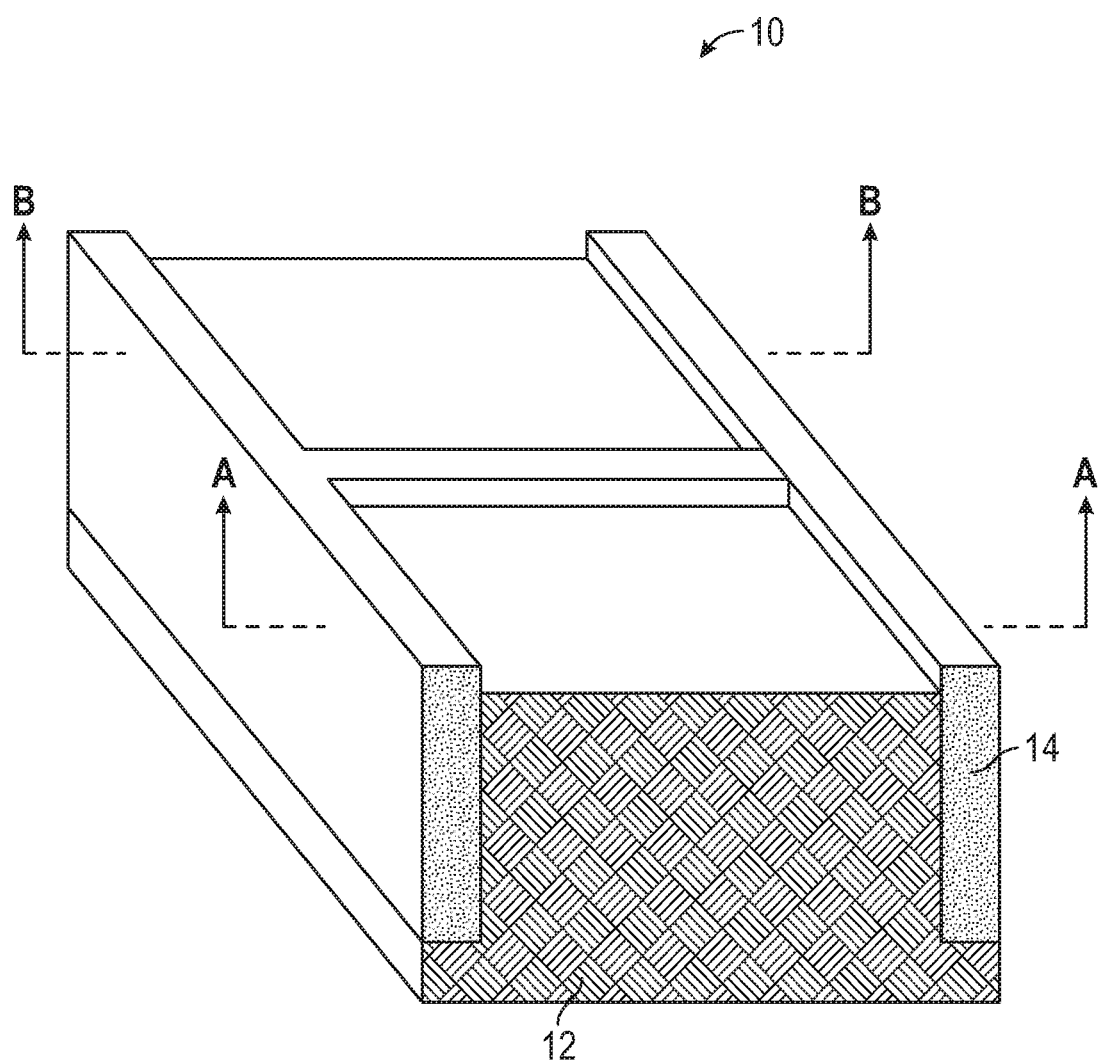
FIG. 1 is a sectional perspective view of an embodiment of an integrated circuit with planes that provide a reference for FIGS. 2-8 and 11.

Reference is made to FIG. 1. An integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The term "primarily includes," as used herein, means the specified material is present in the specified component at a concentration of at least about 50 weight percent, based on a total weight of the component. The substrate 12 may be a bulk silicon wafer (as illustrated in FIG. 1) or may be a thin layer of silicon on an insulating layer (commonly known as silicon-on-insulator or SOI, described more fully below) that, in turn, is supported by a handle layer.

An isolation structure 14 is formed in the substrate 12, where the isolation structure 14 is formed of an electrical insulating material. As used herein, an "electrical insulating material" is a material with a resistivity of about $1 \times 10^4$ ohm meters or more, an "electrical conducting material" is a material with a resistivity of about $1 \times 10^{-4}$ ohm meters or less, and an "electrical semiconducting material" is a material with a resistivity of from about more than $1 \times 10^{-4}$ ohm meters to less than about $1 \times 10^4$ ohm meters. There may be a plurality of isolation structures 14 in an exemplary embodiment.

The isolation structure 14 may be formed in a variety of manners. In an exemplary embodiment, a trench (not illustrated) is formed in the substrate 12 by any suitable means. The trench may be positioned lithographically, and then anisotropically etched into the substrate 12, such as with a reactive ion etch using silicon hexafluoride. The trench extends into the substrate 12 to a desired depth that is sufficient to electrically isolate adjacent sections of the substrate 12 for a desired purpose. The trench is then filled with an electrically insulating material, such as silicon dioxide, which may be deposited by chemical vapor deposition using silane and oxygen. Overburden may then be removed, such as by chemical mechanical planarization to produce the isolation structure 14.

FIG. 1 includes Planes A-A and B-B. Several FIGS. are taken along Planes A-A and B-B, where the right side image is taken along Plane A-A and the left side image is taken along Plane B-B.

Figure 2:
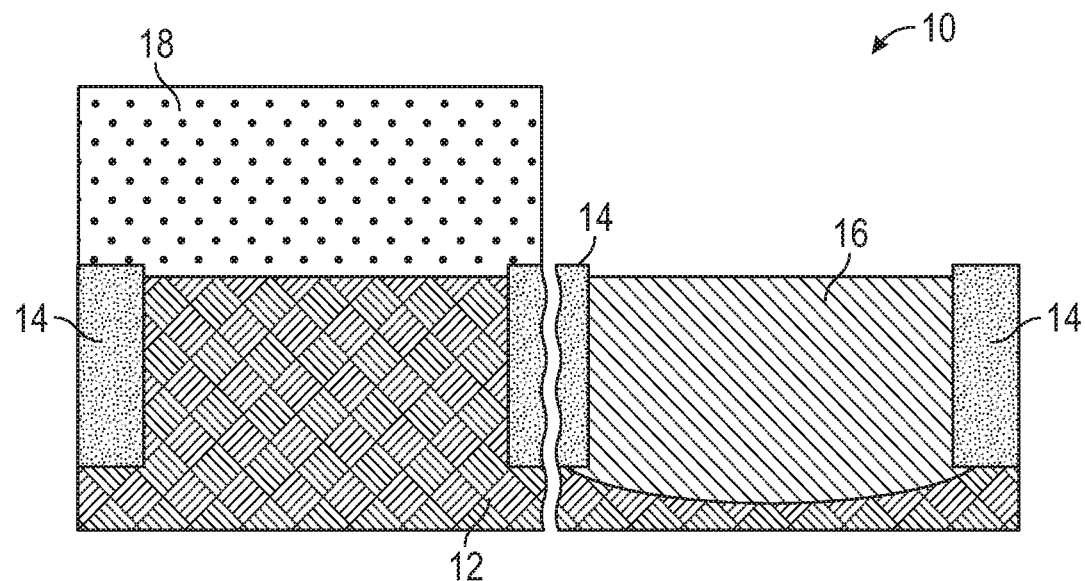
FIGS. 2-8 and 11 are cross sectional views of embodiments of an integrated circuit, and methods for producing the same.

Referring now to FIG. 2, the right side image is taken from Plane A-A in FIG. 1, and the left side image is taken from Plane B-B in FIG. 1. The two sides are shown side by side to better illustrate an exemplary manufacturing process for one exemplary embodiment. A transistor well 16 is formed in the substrate 12 by implanting conductivity determining impurities. In an exemplary embodiment, a transistor well photoresist 18 is formed overlying the substrate 12, and then patterned. As used herein, the term "overlying" means "over" such that an intervening layer may lie between the overlying component (the transistor well photoresist 18 in this example) and the underlying component (the substrate 12 in this example), or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of FIG. 2. It is to be understood that spatially relative terms refer to the orientation in FIG. 2, so if the integrated circuit 10 were to be oriented in another manner the spatially relative terms would still refer to the orientation depicted in FIG. 2. Thus, the exemplary terms "over" and "under" remain the same even if the device is twisted, flipped, or otherwise oriented other than as depicted in the figures.

The transistor well photoresist 18 is patterned to expose the portion of the substrate 12 that will become the transistor well 16 while covering other portions of the substrate 12. The transistor well photoresist 18 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the transistor well photoresist 18 remains overlying the other areas of the substrate 12. The transistor well photoresist 18 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane. The transistor well photoresist 18 (and other photoresists described below) may be removed after use, such as with an oxygen containing plasma.

The transistor well 16 is formed by implanting conductivity determining impurities into the substrate 12 in the exposed areas formed by the transistor well photoresist 18. As such, the transistor well 16 is defined within the substrate 12. In an exemplary embodiment, the transistor well 16 is formed by implanting "P" type conductivity determining impurities (i.e. dopants) as ions into the upper surface of the substrate 12. "P" type conductivity determining impurities typically include boron, aluminum, gallium, and indium, but other materials could also be used. "N" type conductivity determining impurities typically include phosphorous, arsenic, and/or antimony, but other materials could also be used. The transistor well 16 may be formed with "N" type conductivity determining impurities in some embodiments. Ion implantation involves ionizing the conductivity determining impurity and propelling the ion into the substrate 12 under the influence of an electrical field. The transistor well 16 may then be annealed to repair crystal damage from the ion implantation process, to electrically activate the conductivity determining impurities, and to redistribute the conductivity determining impurities within the semiconductor material. The annealing process can use widely varying temperatures, such as temperatures ranging from about 500 degrees centigrade (° C.) to about 1,200° C. Thermal implantation or other techniques may also be used to form the transistor well 16 in alternate embodiments.

Figure 3:
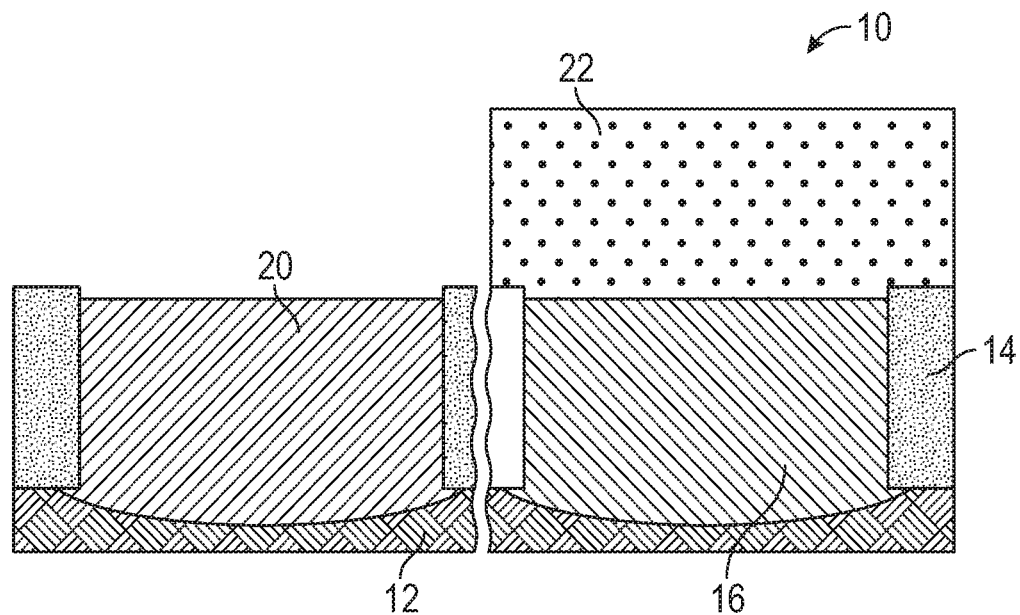

Referring now to FIG. 3, the same convention is utilized with the right side image taken from Plane A-A of FIG. 1 and the left side image taken from Plane B-B of FIG. 1. This convention is followed for all the side sectional views in FIGS. 2-8 and FIG. 11, and will not be repeated below for every FIG. A capacitor well 20 is formed in the substrate 12, so the capacitor well 20 is also defined within the substrate 12. The capacitor well 20 is formed using a capacitor well photoresist 22, similar to how the transistor well 16 was positioned. The capacitor well 20 may include "N" type conductivity determining impurities in some embodiments, but the capacitor well 20 may also include "P" type conductivity determining impurities. The capacitor well 20 and the transistor well 16 may primarily include either the same type of conductivity determining impurity, or different types of conductivity determining impurities in different embodiments. Embodiments where the capacitor well 20 and the transistor well 16 primarily include the same type of conductivity determining impurity may also include an isolation well (not illustrated) underlying the capacitor well 20, the transistor well 16, and the intervening isolation structure 14 to more effectively isolate the capacitor well 20 and transistor well 16 from each other. In an exemplary embodiment, the transistor well 16 and the capacitor well 20 are separated by an isolation structure 14, and there may be isolation structures 14 on opposite sides of one or both of the transistor well 16 and the capacitor well 20.

Figure 4:
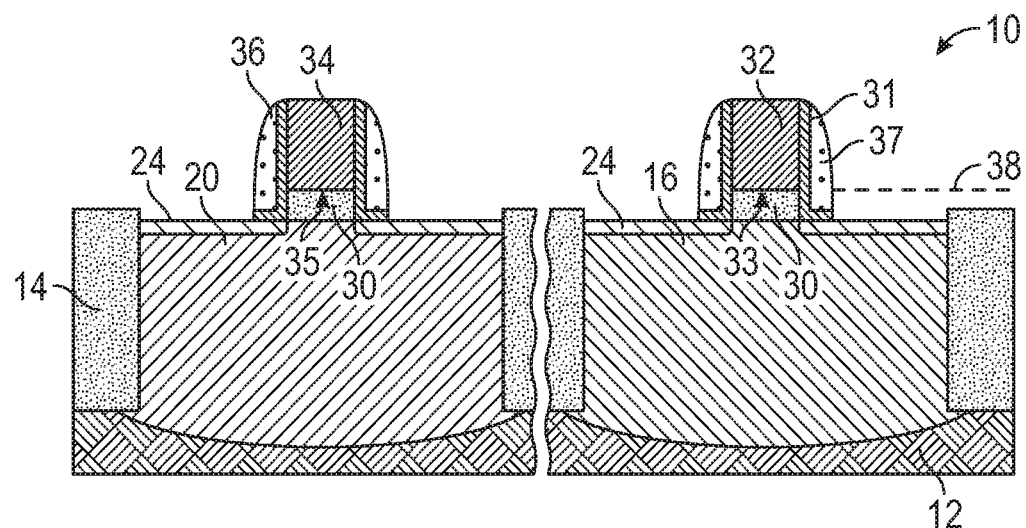

A gate insulator 30 is formed overlying the substrate 12, and a transistor gate electrode 32 and a capacitor gate electrode 34 are formed overlying the gate insulator 30 and overlying the transistor well 16 and the capacitor well 20 respectively, as illustrated in an exemplary embodiment in FIG. 4. A gate insulator 30 is formed of an electrically insulating material, such as silicon dioxide, but other electrically insulating materials may be utilized in alternate embodiments. The transistor gate electrode 32 and the capacitor gate electrode 34 are formed of electrically conductive materials, and may include polysilicon with a sufficient concentration of conductivity determining impurities (i.e., dopants) to render the transistor and capacitor gate electrodes 32, 34 electrically conductive. Polysilicon may be formed by low pressure chemical vapor deposition in a silane environment, and the selected conductivity determining impurity may be included in the deposition process. Once the material for the gate insulator 30 and the transistor and capacitor gate electrodes 32, 34 are deposited, the transistor and capacitor gate electrodes 32, 34 may be formed by lithographically protecting the selected areas and removing the gate and insulator material from elsewhere with an appropriate etchant. For example, polysilicon can be removed with a reactive ion etch using hydrogen bromide, and silicon dioxide may be removed with a wet etch using dilute hydrofluoric acid. However, other etchants or removal techniques may be utilized in alternate embodiments. In an exemplary embodiment, the transistor gate electrode 32 has a transistor gate bottom surface 33 at a gate level 38 above the substrate 12, and the capacitor gate electrode 34 has a capacitor gate bottom surface 35 at the same gate level 38. As such, the transistor and capacitor gate electrodes 32, 34 are at the same level in some embodiments, and the upper surfaces of the transistor and capacitor gate electrodes 32, 34 may also be at the same level. However, in alternate embodiments, the transistor gate electrode 32 and the capacitor gate electrode 34 may be produced such that the respective upper surfaces are at different levels.

Extension wells 24 may be formed in the capacitor well 20 and the transistor well 16 by implanting conductivity determining impurities therein. The transistor and capacitor gate electrodes 32, 34 protect the area underlying them such that the extension well 24 does not extend under the transistor and/or capacitor gate electrodes 32, 34, or only extends under the transistor and/or capacitor gate electrodes 32, 34 for a short distance, and not for the entire width of the transistor and/or capacitor gate electrodes 32, 34. The extension well 24 in the transistor well 16 is formed of the opposite type of conductivity determining impurity as in the underlying transistor well 16. As such, if the transistor well 16 primarily includes "P" type conductivity determining impurities, the extension well 24 formed within the transistor well 16 primarily includes "N" type conductivity determining impurities. There are two extension wells 24 formed within the capacitor well 20, with one on each side of the capacitor gate electrode 34. The two extension wells 24 in the capacitor well 20 primarily include different types of conductivity determining impurities from each other, as explained more fully below. However, in some embodiments the extension wells 24 in the capacitor well 20 may include conductivity determining impurities that are the same type as in the capacitor well 20. Reference herein to a component "primarily" including one type of conductivity determining impurity means that component includes more of the "primary" type of conductivity determining impurity than the opposite type of conductivity determining impurity.

Spacers 36 are formed adjacent to the transistor gate electrode 32, and also adjacent to the gate insulator 30 that is positioned between the transistor gate electrode 32 and the transistor well 16. Other spacers 36 are formed adjacent to the capacitor gate electrode 34 and the gate insulator 30 positioned between the capacitor gate electrode 34 and the capacitor well 20. The spacers 36 are formed of electrically insulating materials, and include two or more components in some embodiments. In an exemplary embodiment, the spacer 36 includes a spacer liner 31 and a spacer body 37, where the spacer liner 31 is positioned between the spacer body 37 and the capacitor gate electrode 34. In an exemplary embodiment, a layer of silicon dioxide is formed and an overlying layer of silicon nitride is then deposited, but other electrically insulating materials or different numbers of layers may be utilized in alternate embodiments. In an exemplary embodiment, silicon dioxide and silicon nitride are blanket deposited followed by an anisotropic etch, which leaves the vertical portions adjacent to the transistor and capacitor gate electrodes 32, 34 as the spacers 36. Silicon dioxide may be deposited by chemical vapor deposition with silane and oxygen, and silicon nitride may be deposited by low pressure chemical vapor deposition using ammonia and silane. A dry plasma etch with hydrogen and nitrogen trifluoride will anisotropically remove the silicon dioxide and silicon nitride. The anisotropic etch is stopped when the horizontal portions of the blanket deposited silicon nitride layers are removed, but before the spacers 36 are removed. Portions of the silicon dioxide layer may be removed with the silicon nitride to form the spacers 36 in some embodiments, but in alternate embodiments (not illustrated) a silicon dioxide layer may be left overlying essentially all of the integrated circuit 10, where the silicon dioxide layer may be removed in selected locations as the manufacturing process continues.

The transistor gate electrode 32 and the capacitor gate electrode 34 are formed at the same time using the same processes in an exemplary embodiment, so no extra processes are required for the capacitor gate electrode 34 other than the processes already utilized for the transistor gate electrode 32. The elimination of separate manufacturing processes for forming the capacitor gate electrode 34 reduces the total number of processes utilized during manufacture of the integrated circuit 10.

Figure 5:
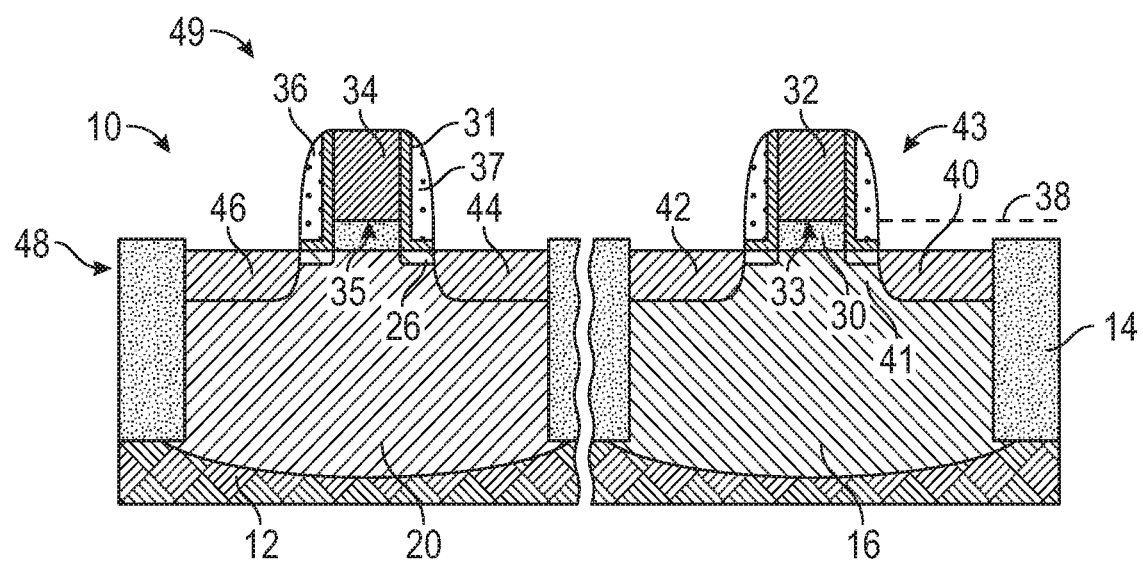

A transistor source 40, a transistor drain 42, and a capacitor first terminal 44 are formed in the substrate, as illustrated in an embodiment in FIG. 5 with continuing reference to FIG. 4. The transistor source 40, the transistor drain 42, and the capacitor first terminal 44 are formed by implanting conductivity determining impurities into the substrate 12 at the designated locations, where other locations are lithographically protected. As such, the transistor source 40, the transistor drain 42, and the capacitor first terminal 44 all primarily include the same type of conductivity determining impurity, and include the conductivity determining impurity at a higher concentration than in the transistor well 16 or the capacitor well 20, respectively. The transistor source 40, the transistor drain 42, and the capacitor first terminal 44 are also formed in extension wells 24, where the transistor source 40, the transistor drain 42, and the capacitor first terminal 44 all primarily include the same type of conductivity determining impurity as the extension well 24 they were formed in. The transistor source 40, the transistor drain 42, and the capacitor first terminal 44 overlap a significant portion of the extension well 24, and the remaining portion of the extension well 24 underlying the spacer 36 is thereby formed into an extension 26. The transistor source 40 and transistor drain 42 primarily include the opposite type of conductivity determining impurity as the transistor well 16. A transistor 43 includes the transistor gate electrode 32, the transistor source and drain 40, 42, a channel 41 that is a portion of the transistor well 16 underlying the transistor gate electrode 32, and the gate insulator 30 positioned between the transistor gate electrode 32 and the channel 41. The transistor source 40, transistor drain 42, and channel 41 are defined within the substrate 12 in an exemplary embodiment.

A capacitor second terminal 46 is formed by implanting conductivity determining impurities into the substrate 12, similar to the process utilized for the capacitor first terminal 44, except the capacitor second terminal 46 is implanted with the opposite type of conductivity determining impurity as the capacitor first terminal 44. As such, in embodiments where the capacitor second terminal 46 primarily includes "P" type conductivity determining impurities, the capacitor first terminal 44 primarily includes "N" type conductivity determining impurities. Therefore, one of the capacitor first or second terminals 44, 46 primarily includes the same type of conductivity determining impurity as the capacitor well 20, and the other of the capacitor first or second terminals 44, 46 primarily includes the opposite type of conductivity determining impurity as the capacitor well 20. Both the capacitor first and second terminals 44, 46 include conductivity determining impurities at a higher concentration than in the capacitor well 20. The capacitor second terminal 46 overlaps a significant portion of one of the extension wells 24, and this extension well 24 and the capacitor second terminal 46 both primarily include the same type of conductivity determining impurity. The remaining portion of this extension well 24 that underlies a spacer 36 is thereby converted into an extension 26. The first terminal 44 also overlaps one of the extension well 24 so the extension well 24 is converted into an extension 26, and the extension 26 of the first terminal 26 primarily includes the same type of conductivity determining impurity as the first terminal 44 in an exemplary embodiment.

Capacitors generally include two plates separated by a dielectric material. In the illustrated embodiment, the capacitor gate electrode 34 serves as a capacitor first plate, and a capacitor second plate 48 includes the capacitor well 20, the capacitor first terminal 44, and the capacitor second terminal 46. The capacitor second plate 48 also includes the extensions 26 underlying the spacers 36 within the capacitor well 20. The capacitor second plate 48 is defined within the substrate 12, and underlies the capacitor gate electrode 34. The capacitor well 20 and the capacitor first and second terminals 44, 46 are electrically connected.

A capacitor 49 includes the capacitor gate electrode 34 that functions as a capacitor first plate, the capacitor second plate 48, and the gate insulator 30 positioned between the capacitor gate electrode 34 and the capacitor second plate 48. In the illustrated embodiment, the capacitor second plate 48 is the region underlying the capacitor gate electrode 34, which includes a portion of the capacitor well 20. The term "electrically connected," as used herein, means electrical current is capable of flowing from one component to another, where the electrical current may or may not flow through an electrically conductive or semiconductive intervening component. The capacitor gate electrode 34 forms the upper plate of the capacitor 49, so no additional capacitor plate is required to be formed above the capacitor gate electrode 34. In some embodiments, the integrated circuit 10 is free of a capacitor plate overlying the capacitor gate electrode 34. Therefore, no additional production techniques are required to produce the capacitor 49.

Figure 6:
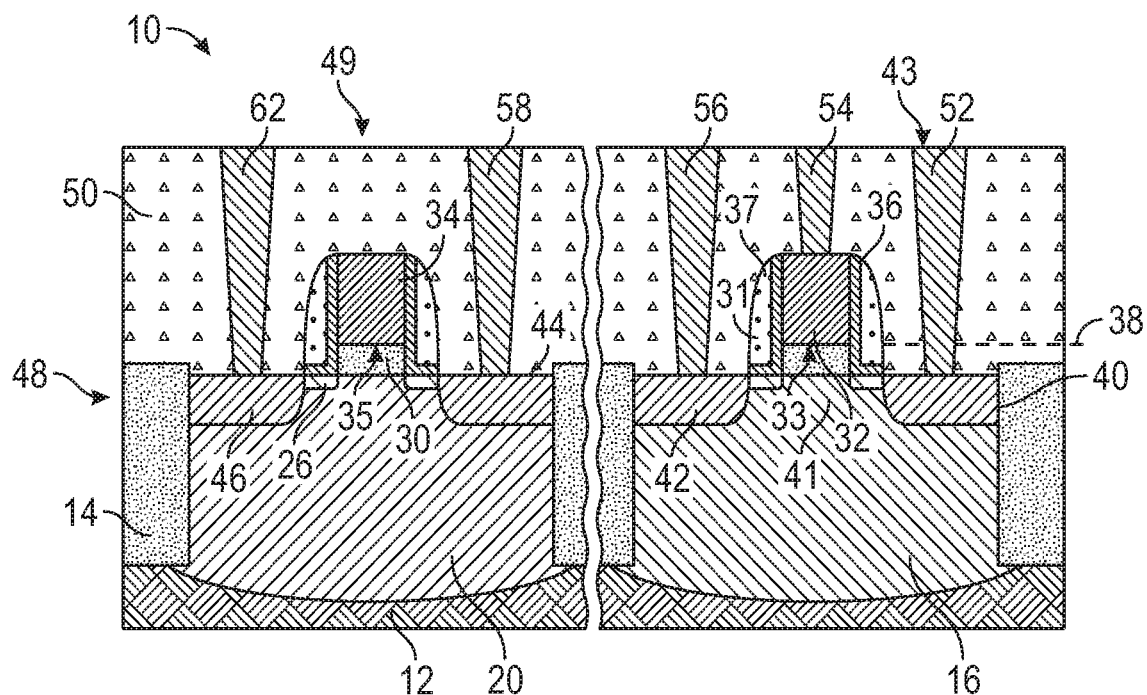

Reference is made to an exemplary embodiment illustrated in FIG. 6. A first interlayer dielectric 50 is formed overlying the substrate 12, where the first interlayer dielectric 50 is formed of an electrically insulating material. In an exemplary embodiment, the first interlayer dielectric 50 includes silicon dioxide, but in alternate embodiments the first interlayer dielectric 50 includes silicon nitride, organic dielectric materials, or other electrically insulating materials. A plurality of contacts are then formed through the first interlayer dielectric, including a transistor source contact 52, a transistor gate contact 54, a transistor drain contact 56, a capacitor first terminal contact 58, and a capacitor second terminal contact 62. The transistor source contact 52, the transistor gate contact 54, the transistor drain contact 56, the capacitor first terminal contact 58, and the capacitor second terminal contact 62 are electrically connected with the transistor source 40, the transistor gate electrode 32, the transistor drain 42, the capacitor first terminal 44, and the capacitor second terminal 46, respectively. The relative positions of the capacitor first and second terminals 44, 46 may be different in various embodiments. The capacitor gate electrode 34 is electrically connected to the transistor gate electrode 32, as explained below and illustrated below. The contacts 52, 54, 56, 58, 62 may be formed by lithographically exposing and etching a via (not illustrated) through the first interlayer dielectric 50, and then depositing an electrically conductive material within the via to form the contacts 52, 54, 56, 58, 62. Overburden may then be removed, such as with chemical mechanical planarization. Tungsten, aluminum, copper, or other electrically conductive materials may be deposited within the via, such as with chemical vapor deposition, but other techniques may also be utilized.

Figure 7:
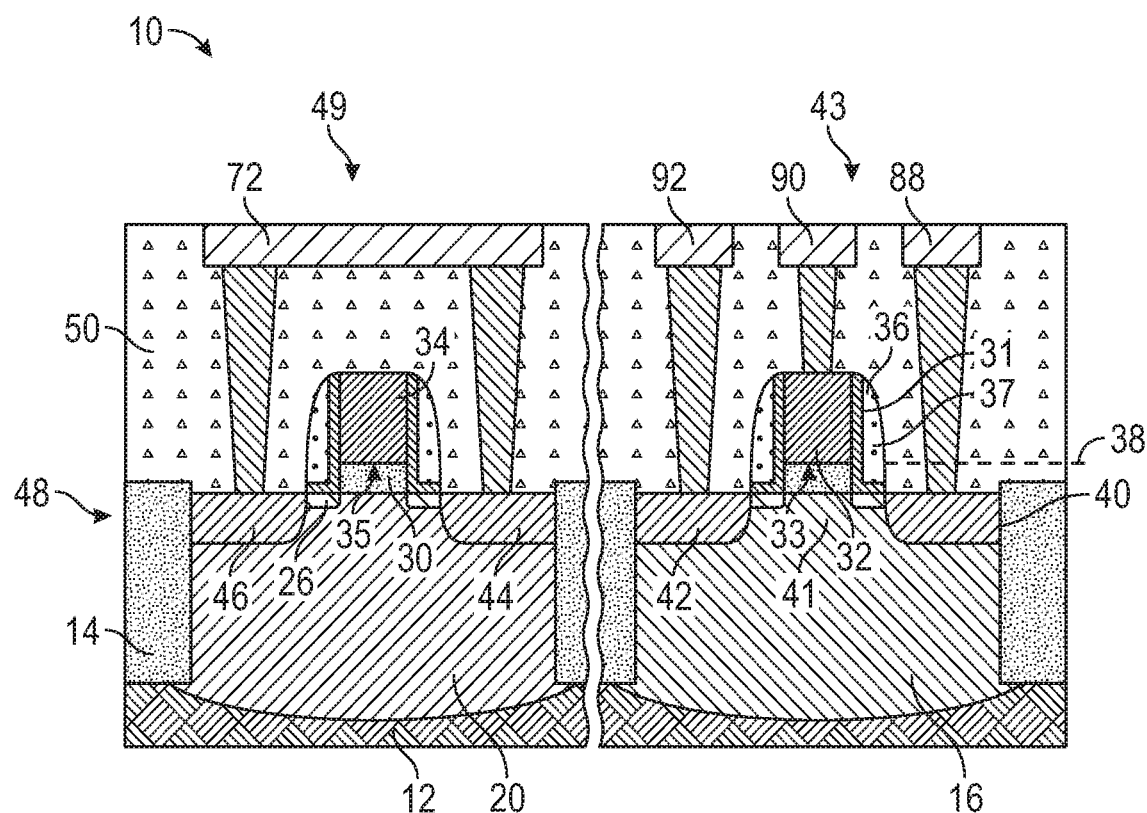

Referring to an exemplary embodiment illustrated in FIG. 7, a capacitor terminal interconnect 72 is formed in the first interlayer dielectric 50, where the capacitor terminal interconnect 72 electrically connects the capacitor first terminal 44 with the capacitor second terminal 46. Other interconnects are also formed in the first interlayer dielectric 50 to make the electrical connects utilized by the integrated circuit 10. The other interconnects may include a transistor source interconnect 88, a transistor gate electrode interconnect 90, and a transistor drain interconnect 92 that are in electrical communication with the transistor source 40, the transistor gate electrode 32, and the transistor drain 42, respectively. The transistor gate electrode 32 and the capacitor gate electrode 34 are electrically connected, as mentioned above and better illustrated in FIG. 9 below, so a separate contact for the capacitor gate electrode 34 is not required in some embodiments. The capacitor terminal interconnect 72 and the other interconnects (i.e., the transistor source interconnect 88, the transistor gate electrode interconnect 90, the transistor drain interconnect 92, and other interconnects not illustrated herein) may be formed by etching a trench in the first interlayer dielectric 50, then filling the trench with an electrically conductive material, and then removing the overburden. In an alternate embodiment that is not specifically illustrated, the trench for the capacitor terminal interconnect 72 is formed in an interlayer dielectric that overlies the first interlayer dielectric 50, and the capacitor terminal interconnect 72 is within an interlayer dielectric formed separately from the first interlayer dielectric 50. Other manufacturing techniques are also possible. In some embodiments, there are a plurality of interlayer dielectrics with a plurality of interconnects formed within each interlayer dielectric. A plurality of contacts are formed to produce the electrical connection paths described herein. Other techniques for electrically connecting different components are also possible.

Figure 8:
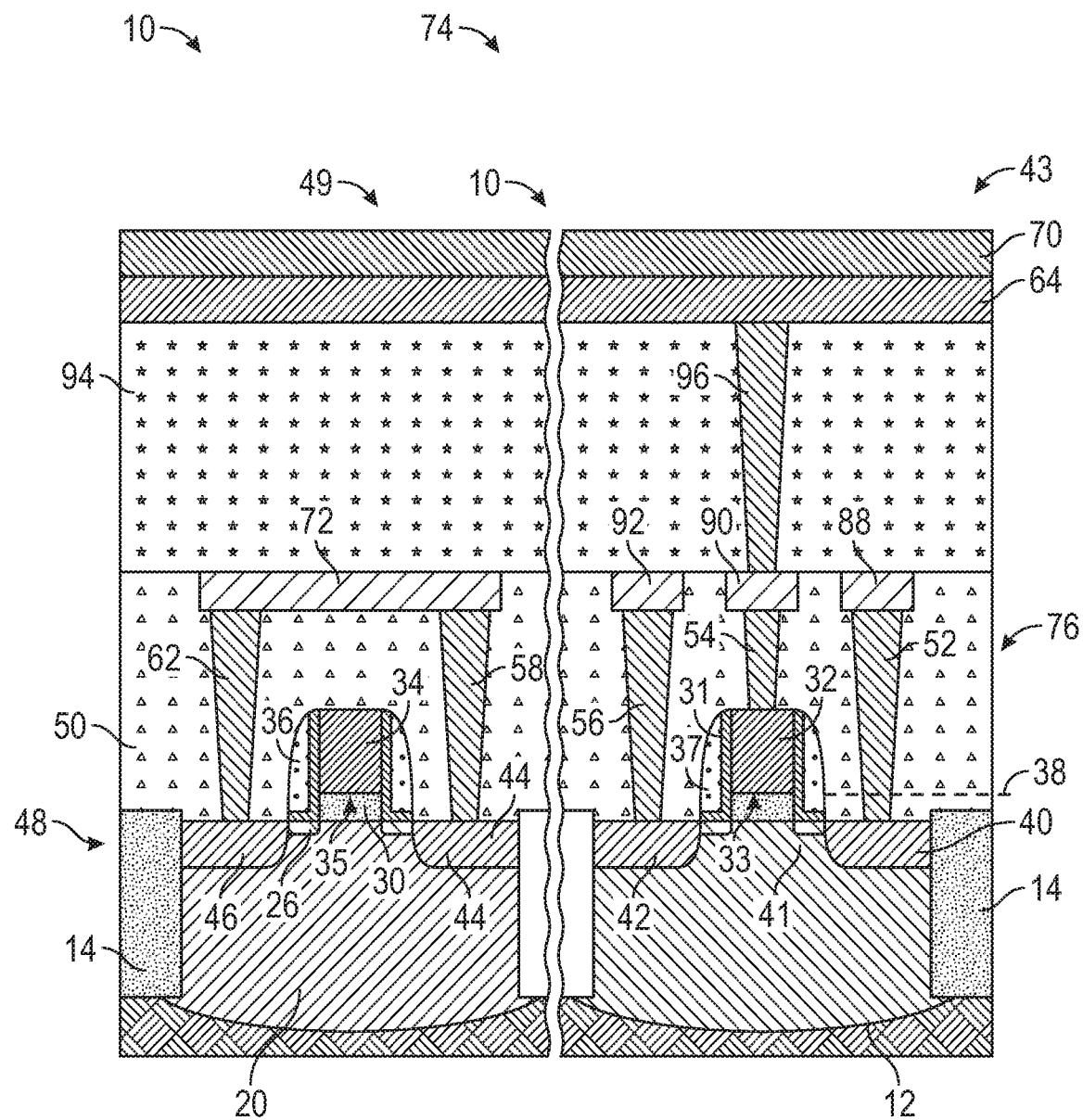

A second interlayer dielectric 94 is formed overlying the first interlayer dielectric 50, as illustrated in FIG. 8. Additional contacts 96 may be formed to electrically connect the transistor gate electrode 32 and the capacitor gate electrode 34, such as through the transistor gate contact 54, the transistor gate electrode interconnect 90, the gate interconnect 64, a capacitor gate contact (not illustrated, and only utilized in some embodiments), a capacitor gate electrode interconnect (not illustrated, and only utilized in some embodiments), and optionally other electrically conductive components. The integrated circuit 10 may include multiple "metal layers" overlying the substrate 12, where the individual metal layers include an interlayer dielectric, contacts, interconnects, and optionally other components to form the electrical communications utilized by the integrated circuit 10. FIG. 8 includes metal layers, but more or fewer metal layers are possible in alternate embodiments. Only two metal layers are included to better illustrate the electrical connections described herein.

A detection layer 70 is formed and electrically connected with the transistor gate electrode 32 and the capacitor gate electrode 34. The detection layer 70 is a biosensor detection layer in an exemplary embodiment, but the detection layer 70 may be capable of detecting stimuli that is not biological in alternate embodiments. For example, the detection layer 70 may be a pH detection layer that is capable of detecting pH values. A wide variety of detection layers 70 are possible, and the manufacturing processes vary for different detection layers 70. In one exemplary embodiment, the detection layer 70 includes a copper electrode with antibody "capture molecules" attached to the copper electrode, but many other embodiments are also possible. The detection layer 70 may include a dielectric layer (not individually illustrated) in some embodiments, including electrically insulating materials such as silicon dioxide, aluminum oxide, tantalum oxide, or other materials. A wide variety of detection layer designs are possible.

A sensor 74 includes the detection layer 70 and associated sensor circuitry 76, where the sensor circuitry 76 includes the capacitor 49 and the transistor 43. The detection layer 70 changes a property when exposed to a stimulus, such as the presence of a specific compound or a change in pH, and the change in the property of the detection layer 70 is read by the sensor circuitry 76. The stimulus that changes the property of the detection layer 70 is ionic in nature in some embodiments. The combination of the detection layer 70 and the associated sensor circuitry 76 forms the sensor 74. Additional circuitry is utilized in detecting a sensing event, producing an electrical signal from that sensing event, amplifying that electrical signal, and further processing the signal produced as a result of the sensing event, and that circuitry is not specifically described in this description.

Figure 9:
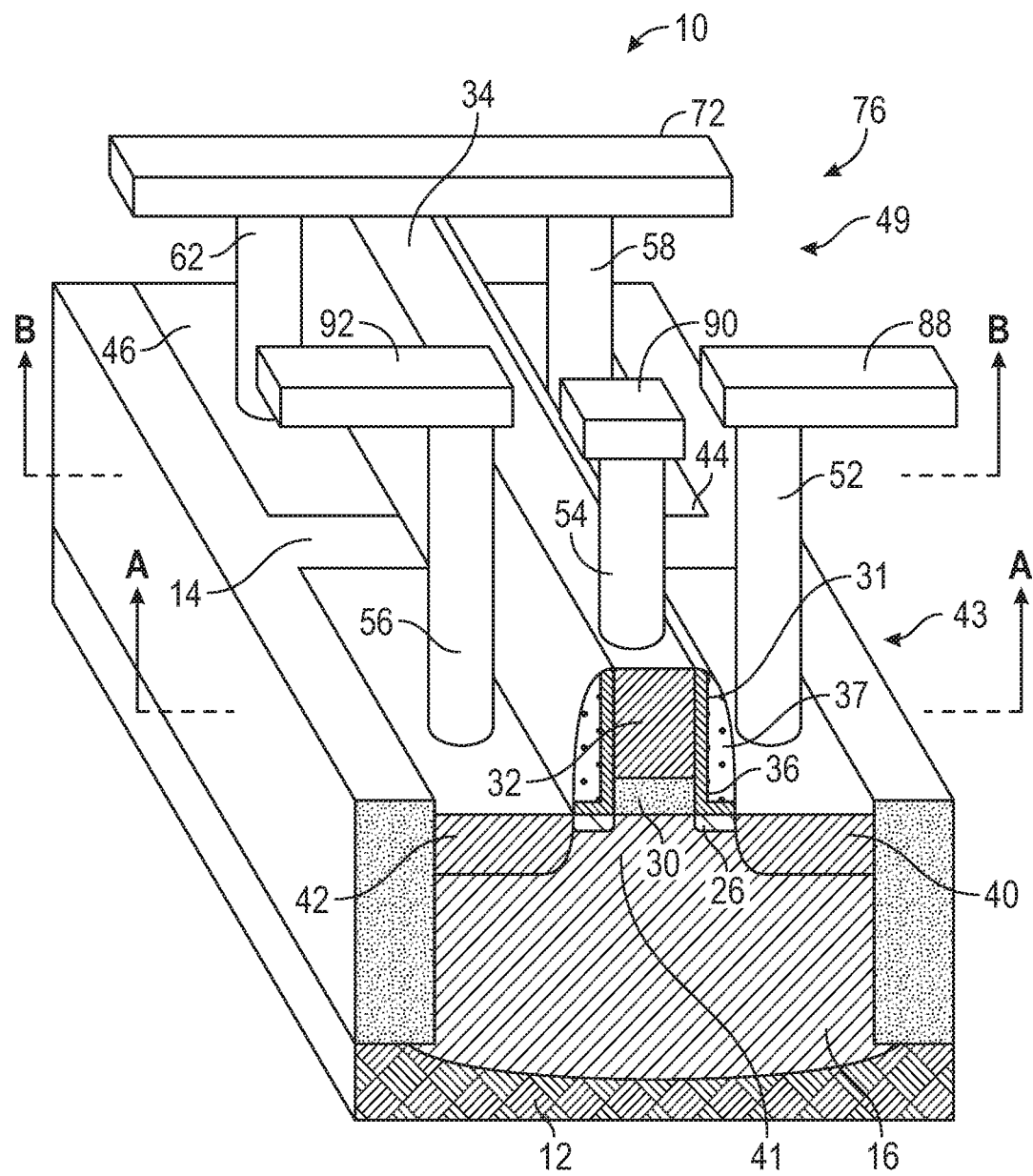
FIG. 9 is a sectional perspective view of an embodiment of an integrated circuit where an interlayer dielectric is not shown to better illustrate other features, and methods of producing the same.
Figure 10:
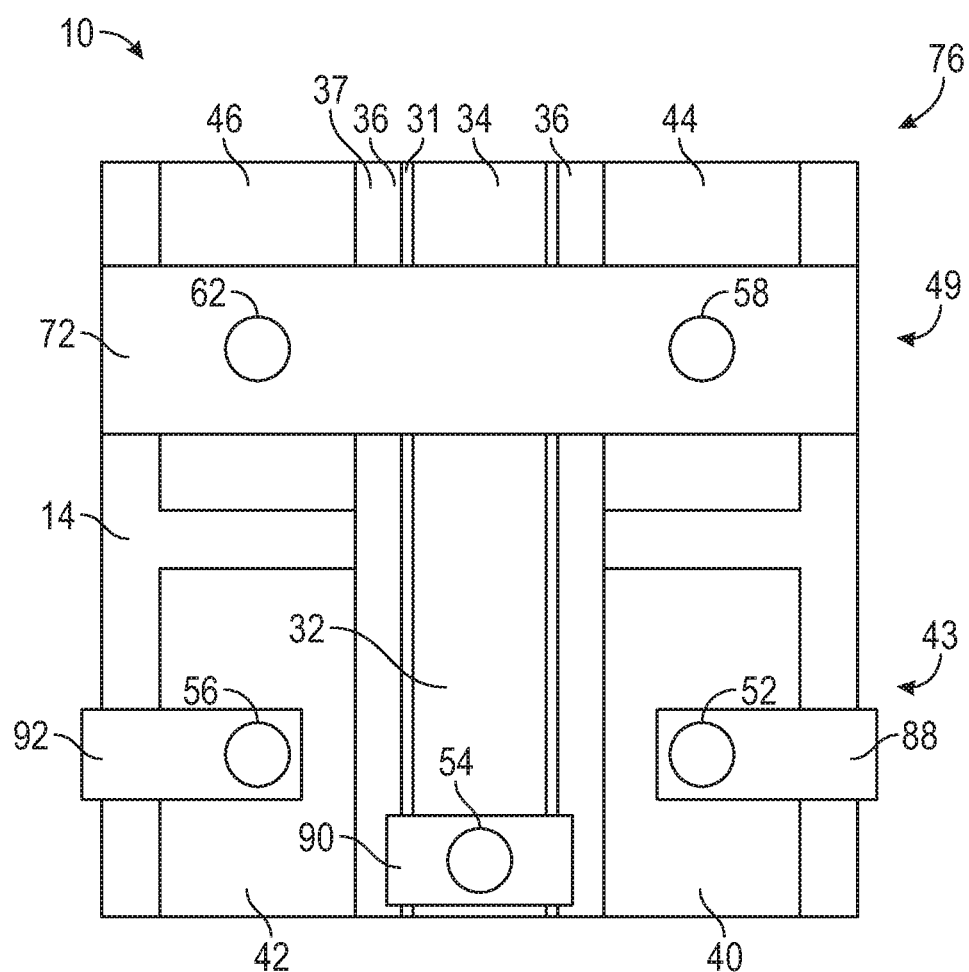
FIG. 10 is a plan view of an embodiment of an integrated circuit, and methods for producing the same.

FIG. 9 illustrates a perspective view of the integrated circuit 10, where Planes A-A and B-B are illustrated as in FIG. 1 to indicate the position of the views in the side sectional views. FIG. 9 illustrates a continuous gate structure that is utilized for the transistor gate electrode 32 and the capacitor gate electrode 34, and this continuous gate structure electrically connects the transistor and capacitor gate electrodes 32, 34, as mentioned above. The transistor and capacitor gate electrodes 32, 34 are differentiated by the transistor and capacitor wells 16, 20 that they overlie, and by the isolation structure 14 between the transistor and capacitor wells 16, 20, as seen in FIG. 9 with reference to FIG. 8. Interlayer dielectrics are not shown in FIG. 9 to more clearly illustrate other features. As illustrated in FIG. 9, the capacitor first and second terminals 44, 46 are electrically connected with the capacitor terminal interconnect 72, but other techniques for forming electrical connections between the capacitor first and second terminals 44, 46 are also possible. The remaining contacts are configured for reading the detection layer 70 using a variety of electrical connections produced in a "back end of the line" process, as briefly described above. FIG. 10 illustrates a top view of FIG. 9, where the capacitor first and second terminal contacts 58, 62 are shown through the capacitor terminal interconnect 72 for illustration purposes. The transistor source contact 52, the transistor gate contact 54, and the transistor drain contact 56 are also shown through the transistor source interconnect 88, the transistor gate electrode interconnect 90, and the transistor drain interconnect 92, respectively, for illustration purposes.

Figure 11:
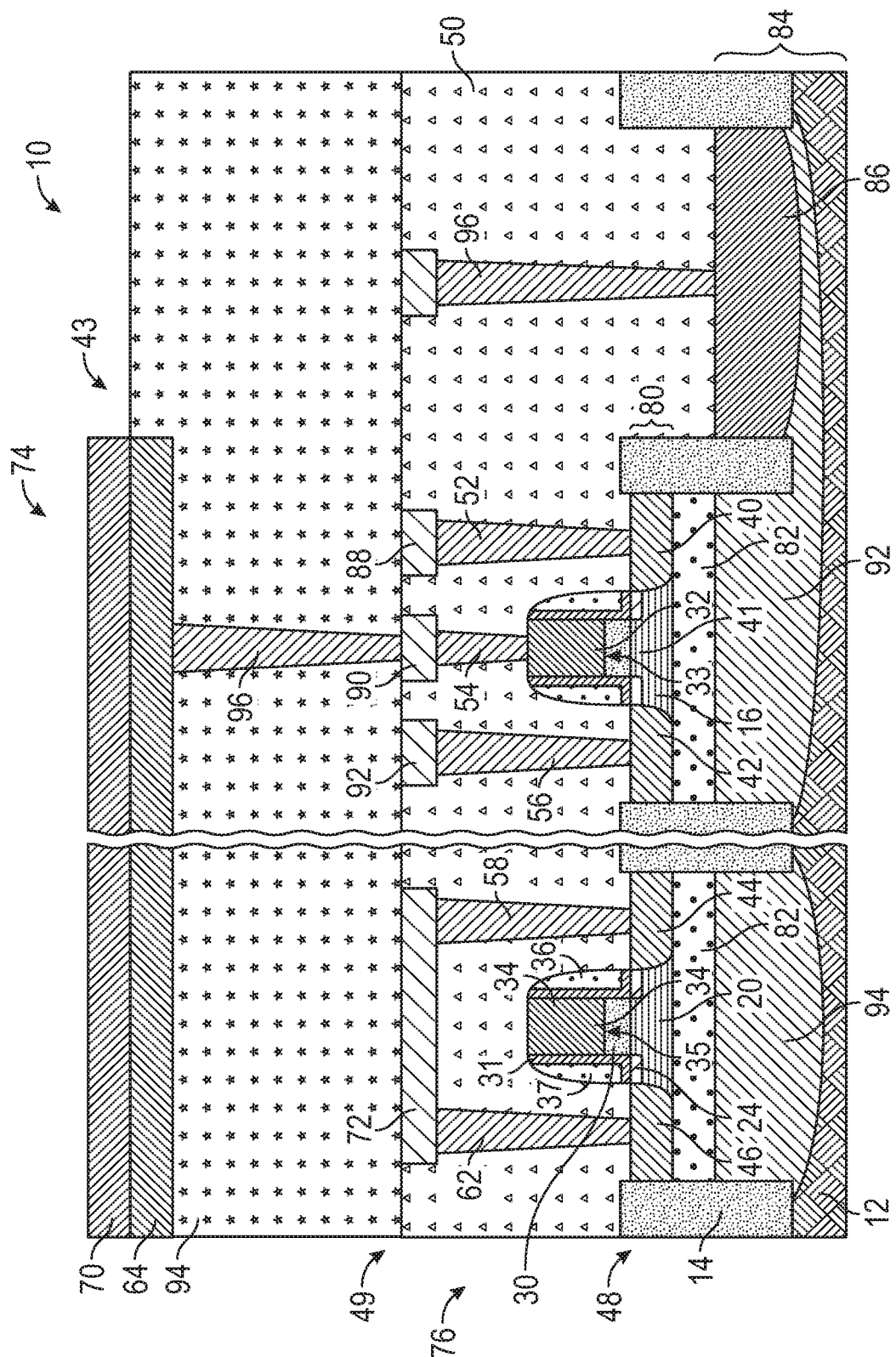

FIG. 11 illustrates an alternate embodiment, where the substrate 12 is an SOI (silicon on insulator) substrate. The substrate 12 in FIG. 11 includes an active layer 80, a buried insulator layer 82, and a handle layer 84. The active layer 80 and handle layer 84 may include monocrystalline silicon, and the buried insulator layer 82 is formed of an electrically insulating material such as silicon dioxide, but other embodiments are also possible. The transistor and capacitor wells 16, 20 are formed in the active layer 82, as well as the transistor source and drain 40, 42 and the capacitor first and second terminals 44, 46. The buried insulator layer 82 may be present under either one or both of the transistor and capacitor wells 16, 20 in various embodiments. A handle terminal 86 may be formed to provide back biasing for one or both of the transistor and capacitor wells 16, 20, and thereby to provide back biasing for one or both of the transistor 43 and/or the capacitor 49. The handle terminal 86 is electrically connected to a contact 96 to provide the biasing voltage. In the illustrated embodiment, the handle terminal 86 is electrically connected to a transistor bias well 98 that underlies the transistor 43 and the buries insulator layer 82. However, in alternate embodiments, the handle terminal 86 may be electrically connected to a capacitor bias well 100 that underlies capacitor 49 and the buried insulator layer 82. The handle terminal 86 may include conductivity determining impurities at a concentration about comparable to that of a source or drain for a typical integrated circuit transistor. In an exemplary embodiment, the handle terminal 86 with primarily include the same type of conductivity determining impurity as the transistor bias well 98 and/or the capacitor bias well 100 to which the handle terminal 86 is electrically connected. The detection layer 70 may or may not overlie the contact 96 that is electrically connected to the handle terminal 86 in various embodiments. There may be more than one handle terminal 86 in some embodiments to provide different back biasing for the capacitor 49 and the transistor 43, or one handle terminal 86 may be electrically connected to both the capacitor bias well 100 and transistor bias well 98 to provide back biasing for both the capacitor 49 and transistor 43.

The capacitor gate electrode 34 and the transistor gate electrode 32 are formed at the same level in some embodiments, with the capacitor second plate 48 positioned underlying the capacitor gate electrode 34. As such, the integrated circuit 10 may be free of a capacitor plate overlying the capacitor gate electrode 34, where the capacitor gate electrode 34 serves as the capacitor first plate and the capacitor second plate 48 underlies the capacitor gate electrode 34. This layout reduces the production techniques required to produce the capacitor 49 relative to a capacitor formed with a capacitor second plate 48 overlying the capacitor gate electrode 34. The different types of conductivity determining impurities primarily present in the capacitor first and second terminals 44, 46 improves coupling, and also facilitates reading of both positive and negative voltage from the detection layer 70. The design with both an "N" and a "P" type capacitor terminal also facilitates use of either a positive or negative voltage to be applied to the capacitor gate electrode 34.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a detection layer;
   a substrate;
   a transistor comprising a first gate electrode, a source, and a drain;
   a first capacitor plate overlying the substrate, wherein the first gate electrode and the first capacitor plate are electrically connected with each other and with the detection layer;
   a second capacitor plate including a capacitor well defined within the substrate, a first capacitor terminal, and a second capacitor terminal; and
   a gate insulator positioned between the capacitor well and the first capacitor plate,
   wherein the capacitor well, the first capacitor terminal, and the second capacitor terminal are electrically connected, the first capacitor terminal and the second capacitor terminal comprise conductivity-determining impurities, and the first capacitor terminal and the second capacitor terminal primarily include different types of conductivity-determining impurities.

2. The integrated circuit of claim 1 wherein:
   the first capacitor plate is a second gate electrode;
   the first gate electrode has a first bottom surface at a gate level; and
   the second gate electrode has a second bottom surface at the gate level.

3. The integrated circuit of claim 2 further comprising:
   a buried insulator layer underlying the transistor.

4. The integrated circuit of claim 3 wherein the buried insulator layer underlies the capacitor well.

5. The integrated circuit of claim 1 further comprising:
   a capacitor terminal interconnect is electrically connected with both the first capacitor terminal and the second capacitor terminal.

6. The integrated circuit of claim 1 wherein the detection layer is a biosensor detection layer.

7. The integrated circuit of claim 1 further comprising:
   a transistor well underlying the first gate electrode; and
   wherein an isolation structure is positioned between the transistor well and the capacitor well.

8. The integrated circuit of claim 1 wherein the first capacitor terminal comprises the conductivity-determining impurities at a higher concentration than in the capacitor well, and the second capacitor terminal comprises the conductivity-determining impurities at a higher concentration than in the capacitor well.

9. The integrated circuit of claim 1 wherein the first capacitor plate is a second gate electrode.

10. A method of producing an integrated circuit, the method comprising:
    forming a first capacitor plate overlying a substrate;
    forming a second capacitor plate including a capacitor well defined within the substrate, a first capacitor terminal, and a second capacitor terminal;
    forming a gate insulator positioned between the capacitor well and the first capacitor plate;

forming a transistor comprising a first gate electrode, a source, and a drain, wherein the first gate electrode overlies the substrate, and the first gate electrode and the first capacitor plate are electrically connected; and forming a detection layer and electrically connecting the detection layer with the first gate electrode and the first capacitor plate, wherein the capacitor well, the first capacitor terminal, and the second capacitor terminal are electrically connected, the first capacitor terminal and the second capacitor terminal comprise conductivity-determining impurities, and the first capacitor terminal and the second capacitor terminal primarily include different types of conductivity-determining impurities.

11. The method of claim 10 wherein the first capacitor terminal comprises the conductivity-determining impurities at a higher concentration than in the capacitor well, and the second capacitor terminal comprises the conductivity-determining impurities at a higher concentration than in the capacitor well.

12. The method of claim 10 wherein the first capacitor plate is a second gate electrode.

13. The method of claim 10 wherein:
the first capacitor plate is a second gate electrode;
the first gate electrode has a first bottom surface at a gate level; and
the second gate electrode has a second bottom surface at the gate level.

14. The method of claim 13 further comprising:
a buried insulator layer underlying the transistor.

15. The method of claim 14 wherein the buried insulator layer underlies the capacitor well.

16. The method of claim 10 further comprising:
forming a capacitor terminal interconnect is electrically connected with both the first capacitor terminal and the second capacitor terminal.

17. The method of claim 10 wherein the detection layer is a biosensor detection layer.

18. The method of claim 10 further comprising:
forming a transistor well that underlies the first gate electrode; and
wherein an isolation structure is positioned between the transistor well and the capacitor well.

* * * * *